United States Patent
Kweon

[11] Patent Number: 6,160,307
[45] Date of Patent: Dec. 12, 2000

[54] SEMICONDUCTOR PACKAGES HAVING SPLIT DIE PAD

[75] Inventor: Young Do Kweon, Seoul, Rep. of Korea

[73] Assignee: Samsung Electronics Co., Ltd., Kyundgi-do, Rep. of Korea

[21] Appl. No.: 08/512,014

[22] Filed: Aug. 7, 1995

[30] Foreign Application Priority Data

Aug. 16, 1994 [KR] Rep. of Korea ............... 94-20086
Jul. 5, 1995 [KR] Rep. of Korea ............... 95-19636

[51] Int. Cl.[7] ........................................... H01L 23/495
[52] U.S. Cl. ........................ 257/676; 257/782; 257/924
[58] Field of Search ........................ 257/676, 666, 257/924, 782

[56] References Cited

U.S. PATENT DOCUMENTS

| 4,595,945 | 6/1986 | Graver | 357/70 |
|---|---|---|---|
| 4,714,952 | 12/1987 | Takekawa et al. | 257/676 |
| 5,021,864 | 6/1991 | Kelly et al. | 257/676 |
| 5,065,224 | 11/1991 | Fraser et al. | 357/70 |
| 5,457,340 | 10/1995 | Templeton, Jr. et al. | 257/676 |

OTHER PUBLICATIONS

Microelectronic Packaging Handbook, Noise Containment. pp. 143–153.

*Primary Examiner*—Roy Potter
*Attorney, Agent, or Firm*—Pillsbury Madison & Sutro LLP

[57] ABSTRACT

A semiconductor package including a semiconductor chip having a plurality of bonding pads, a die pad onto which the chip is mounted using a non-conductive adhesive, and a lead frame formed so as to have a plurality of inner and outer leads connected electrically to the bonding pads. The die pad is split into two or more segments, which are coupled together through a non-conductive connector.

12 Claims, 6 Drawing Sheets

FIG. 9
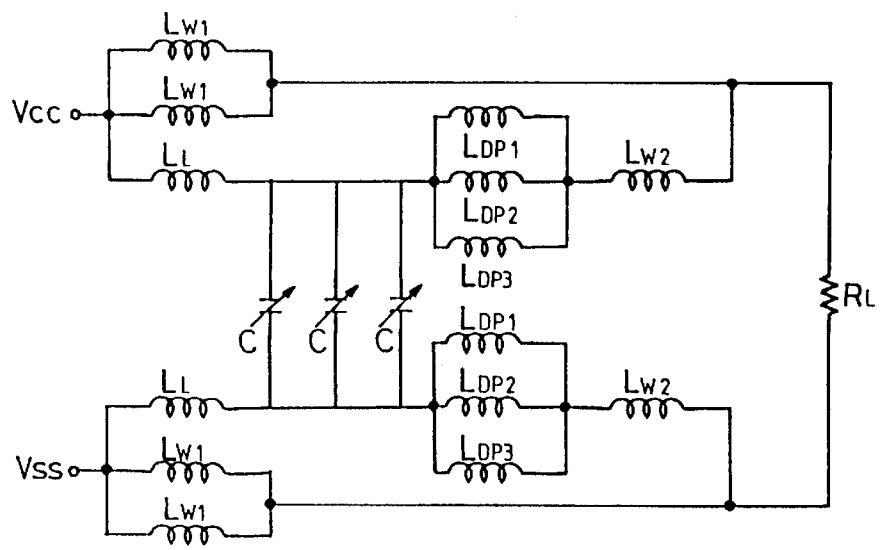
FIG. 10 A
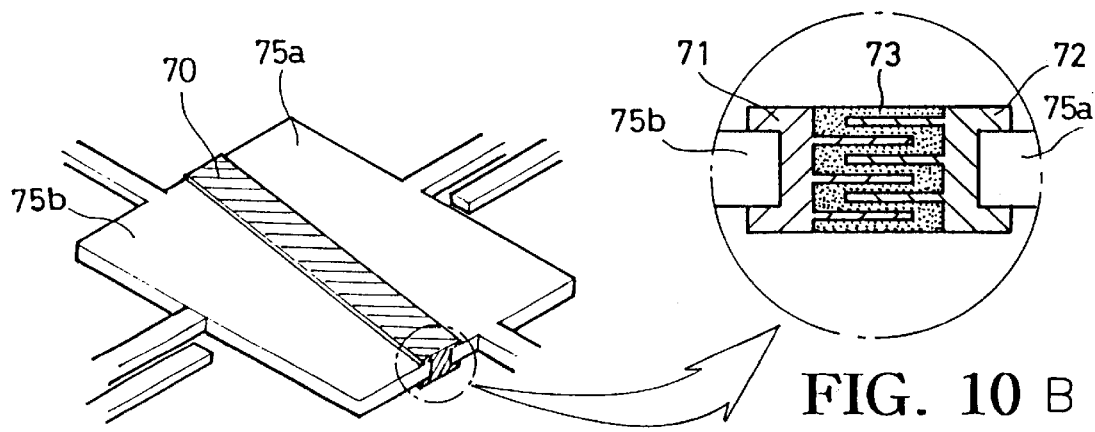
FIG. 10 B

SEMICONDUCTOR PACKAGES HAVING SPLIT DIE PAD

BACKGROUND OF THE INVENTION

1. Field of the Invention

The present invention relates generally to semiconductor packages having split die pad, and, more particularly, to semiconductor packages in which die pad is split into two or more segments, said split die pad segments being coupled to each other by a non-conductive resin or a multi-layer capacitor, thereby preventing a leakage of adhesive interposed between semiconductor chip and the die pad, and reducing electrical noise.

2. Description of the Prior Arts

Recently, there has been a trend to make modules and surface mounting packages compact and thin in order to give highly densed mounting semiconductor packages. In compliance with this trend, compact and thin packages such as TSOP (Thin Small Outline Package) or UTSOP (Ultra Thin Small Outline Package) had been developed, which are used mainly for main memory devices of computers.

The integration density of IC can be increased by increasing the semiconductor element and metal wiring counts, or by increasing the area of a semiconductor chip. However, as very large scale integrated (LSI) circuits tend to get more complex, there is a need to switch more output driver circuits simultaneously at a faster rate in order to increase the performance thereof. This increase in the switching rate results in an increase in the amount of electrical noise which is associated therewith, and this noise problem becomes more severe in connection with the increase in the input and output pin counts.

Noise ($\Delta V$) can be expressed by:

$$\Delta V = L(di/dt)$$

wherein, $\Delta V$ is a size of noise,

L is an inductance, di is a change in current, and dt is a change in time.

As can be seen from the above equation, noise can be reduced by reducing either inductance (L) or the current change rate (di/dt). However, because the di/dt is a parameter related to the speed of the semiconductor elements and increases as the operation speed of the elements increases, inductance should be reduced in order to compensate the increase in the di/dt, or to reduce noise.

Inductance component of the semiconductor elements is mainly governed by the lead frame, the connecting means, such as bonding wires, for electrically connecting the chip with the lead frame, or bumpers. In general, because the plastic package contains lead frame made of alloy 42, or copper (for example, OLIN 194), and connecting means made of Au, inductance varies depending on the configuration of lead frame, or connection manner of Au wires.

FIG. 1 is a perspective view of a conventional semiconductor package. The package depicted in FIG. 1 is of corner power type, and has a structure that a semiconductor chip (12) is mounted onto die pad (11), and bonding pads (13a, 13b) are formed at opposite corners of the chip (12), said bonding pads (13a, 13b) being electrically connected through gold or copper wires (14) to inner leads (16) connected to ground terminal (hereinafter referred to as "Vss") and, to inner leads (17) connected to power terminal (hereinafter referred to as "Vcc"). Tiebars (15a, 15b), which are coupled to die pad (11) of lead frame, are connected either to Vss for the P type chip or, to Vcc for the N type chip.

For this package, the reduction of inductance has a limitation due to a long length of wires because the bonding pads are formed at the corners, although a plurality of parallel wires connect the Vcc and Vss to the chip.

FIG. 2 is a perspective view of a conventional center power type semiconductor package. The package depicted in FIG. 2 has a structure that a semiconductor chip (22) is mounted onto die pad (21), and bonding pads (23a, 23b) are formed at centers of opposite sides of the chip (22), said bonding pads (23a, 23b) being electrically connected through gold or copper wires (24) to inner leads (26a, 26b) connected to Vss, and to inner leads (27a, 27b) connected to Vcc. Tiebars (25a, 25b), which are coupled to die pad (21) of lead frame, are connected either to Vss for the P type chip, or to Vcc for the N type chip.

For this package, the reduction of inductance may be accomplished to some extent by forming inner leads (26a, 26b, 27a, 27b) connected either to Vcc or to Vcc at centers of opposite sides so as to reduce the length of these inner leads. Nevertheless, the reduction of inductance by virtue of the reduction of the length of inner leads is not sufficient to compensate the increase in noise due to the increase in the operation speed of elements.

FIG. 3 depicts another conventional semiconductor package having split die pad in order to avoid the problems associated with the packages depicted in FIG. 1 and FIG. 2.

With reference now to FIG. 3, a semiconductor chip (33) is mounted onto die pad (31) by an adhesive (32), and is electrically connected to inner leads (35) through gold or copper wires (34). The resin molding (36) is formed to provide a protection from external environment, for example moisture or heat, and outer leads (37) are modified, for example, J-bent in order to be suitable for the mounting on printed circuit board (not shown). Die pad (31) is split into two segments by disjunction part (39), and each segment is coupled to Vcc or Vss, respectively.

This type of semiconductor package has an advantage that noise can be reduced by distributing power supplied to the chip. However, it also has a severe disadvantage that the adhesive (32) interposed between the die pad (31) and the chip (33) leaks into the disjunction part (39) and causes a formation of crack (39a) of the molding resin (36), resulting eventually in a package failure.

SUMMARY OF THE INVENTION

An object of the present invention is to provide a highly reliable and low noise semiconductor package without problems associated with the conventional semiconductor packages, characterized in that die pad is split into two or more segments which are coupled to each other by a resin or a multi-layer capacitor.

The present invention encompasses a semiconductor package comprising a semiconductor chip having a plurality of bonding pads, a die pad onto which said chip is mounted by a non-conductive adhesive, and a lead frame formed with a plurality of inner and outer leads connected electrically to said bonding pads, characterized in that said die pad is split into two or more segments, which are coupled together through a non-conductive connecting means.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which:

FIG. 9 is a schematic circuit diagram showing the connections of the chip with external terminals by using the lead frame depicted in FIG. 8;

FIG. 10 is a perspective view of the lead frame having split die pad, said split die pad being divided into two segments, which are connected together by a multi-layer capacitor; and a partial enlarged view of the multi-layer capacitor;

DETAILED DESCRIPTION OF THE INVENTION

The present invention will now be described in more detail with reference to accompanying drawings. Only the bonding pads necessary for supplying power, i.e., connected either to Vss or to Vcc are shown.

Figure 1:
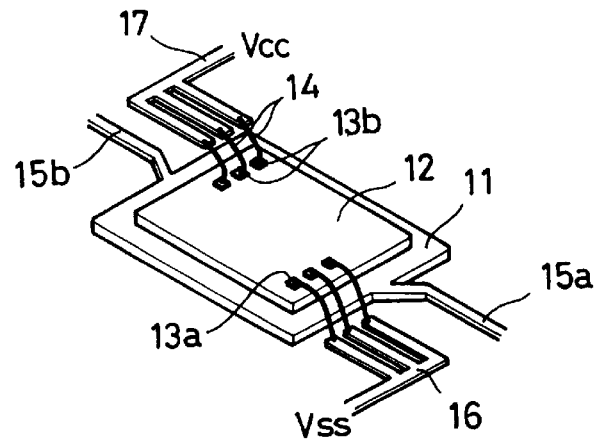
FIG. 1 is a perspective view of one embodiment of the conventional corner power type semiconductor packages.
Figure 2:
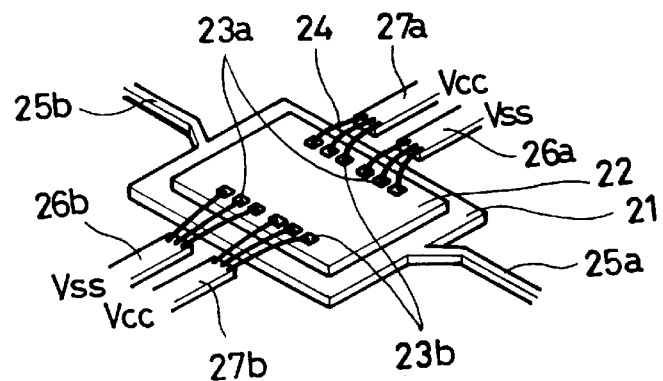
FIG. 2 is a perspective view of one embodiment of the conventional center power type semiconductor packages.
Figure 3:
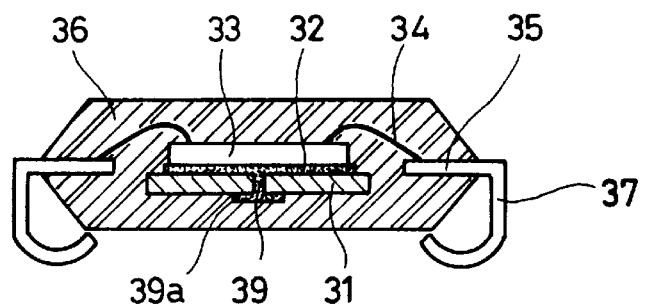
FIG. 3 is a cross-sectional view of the semiconductor package having conventional split die pad.
Figure 4:
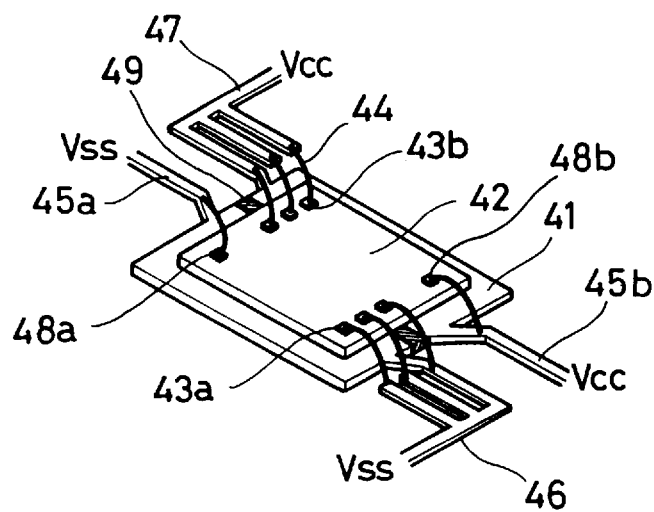
FIG. 4 is a perspective view of one embodiment of corner power type semiconductor package having split die pad according to the present invention.

FIG. 4 is a perspective view of one embodiment of corner power type semiconductor package having split die pad according to the present invention.

With reference to FIG. 4, the corner power type semiconductor package has a structure that a semiconductor chip (42) is mounted onto split die pad (41), and bonding pads (43a, 43b) are formed at opposite corners of the chip (42). Bonding pads (43a) are electrically connected through wires (44) and inner leads (46) to external Vss, while bonding pads (43b) are electrically connected through wires (44) and inner leads (47) to external Vcc.

Die pad (41) is split into two segments, one of which is coupled to inner lead (46) and the other is coupled to inner lead (47). A tiebar (45a) coupled to one segment of split die pad is coupled to bonding pad (48a) through a wire to supply ground voltage Vss, and the other tiebar (45b) coupled to another segment of split die pad is coupled to bonding pad (48b) through a wire to supply power voltage Vcc.

Two segments of split die pad are coupled together through a thermosetting resin (49) filling in the disjunction part, said resin having a similar coefficient of thermal expansion to that of the molding resin, and including, for example an acryl, an epoxy, a silicon or polyimide resin. The thermosetting resin must have no electric conductivity in order to maximize the effect of split of die pad.

Figure 5A:
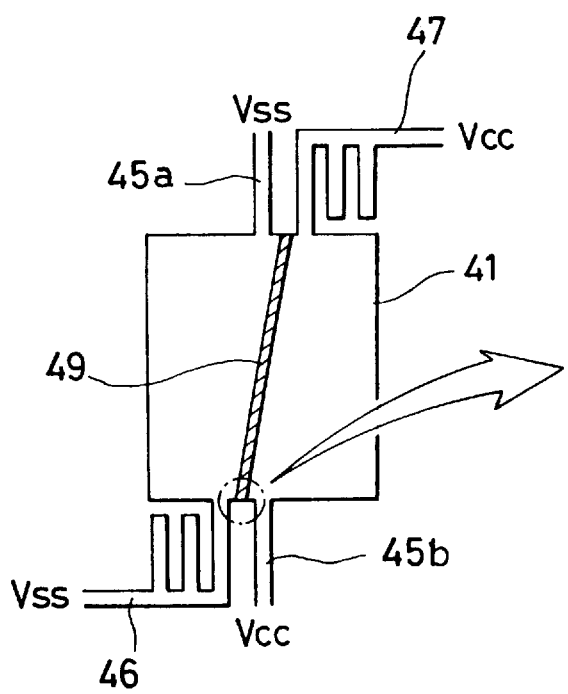
FIG. 5 is a plan view of a lead frame used for manufacturing the semiconductor package depicted in FIG. 4.
Figure 5B:
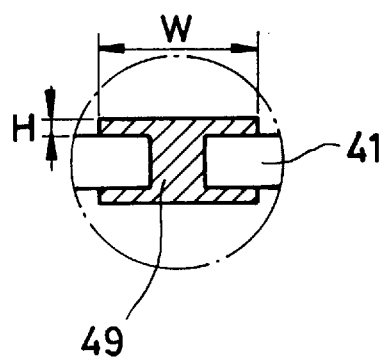

FIG. 5 is a plan view of a lead frame used for manufacturing the semiconductor package depicted in FIG. 4. Two segments of split die pad (41) are coupled together by a thermosetting resin (49). The disjunction part filled with a resin has the "I" shape, as shown in an enlarged view thereof, so as to assure a secure coupling of two segments. One segment of the split die pad (41) is coupled to tiebar (45b) and inner lead (47), which are connected to Vcc, while the other segment is coupled to tiebar (45a) and inner lead (46), which are connected to Vss.

The width (W) and the height of the resin (49) covering the surface of the die pad (41) is preferably more than 20 μM to assure a secure coupling of segments, and less than 40 μm so as not to cause an increase in the total height of the package, respectively.

The above described corner power type semiconductor package according to the present invention has a low noise because the powers, Vcc and Vss are supplied through the split die pad. Since the segments of split die pad are firmly coupled together by a non-conductive thermosetting resin, the insulation between the segments is assured, and there is no possibility of leakage of adhesive. Furthermore, because the resin has a similar coefficient of thermal expansion to that of the molding resin, the package failure due to the formation of crack can be significantly reduced.

Figure 6:
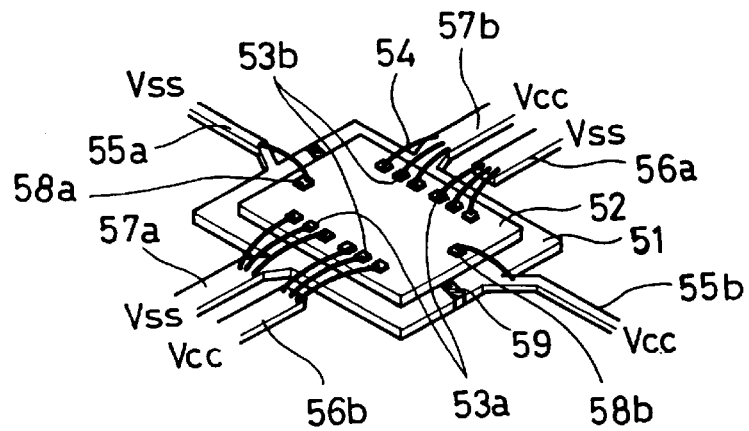
FIG. 6 is a perspective view of one embodiment of center power type semiconductor package having split die pad according to the present invention.

FIG. 6 is a perspective view of one embodiment of center power type semiconductor package having split die pad according to the present invention. The center power type package makes it possible to reduce the length of wires for connecting the package to external power supply terminals.

With reference now to FIG. 6, a semiconductor chip (52) is mounted onto die pad (51), and bonding pads (53a, 53b, 58a, 58b) are placed at centers of opposite sides of the chip (52). The bonding pads (53a) are electrically connected through wires (54) to inner lead (56a) connected to Vss, and the bonding pads (53b) are electrically connected through wires to inner lead (57b) connected to Vcc. One segment of split die pad (51) is coupled to tiebar (55a) which is connected to Vss, while the other segment is coupled to tiebar (55b) which is connected to Vcc.

Two segments of split die pad (51) are coupled together through a thermosetting resin (49) filling in the disjunction part, said resin having a similar coefficient of thermal expansion to that of the molding resin, and including, for example an acryl, an epoxy, a silicon or polyimide resin. The thermosetting resin must have no electric conductivity in order to maximize the effect of split of die pad.

Figure 7A:
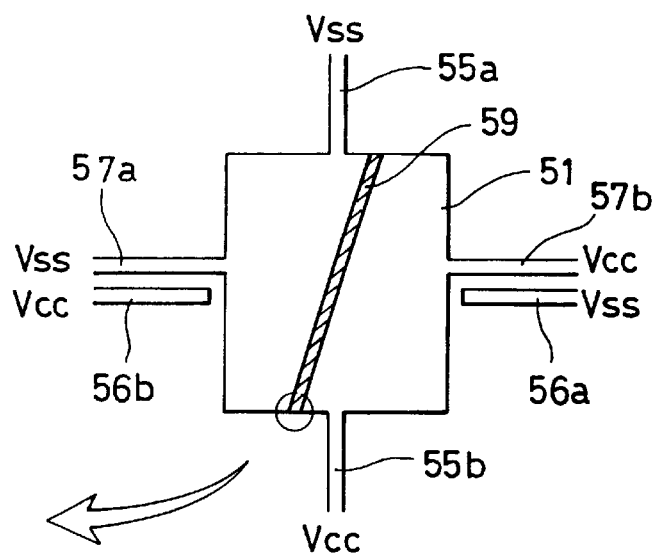
FIG. 7 is a plan view of a lead frame used for manufacturing the semiconductor package depicted in FIG. 6.
Figure 7B:
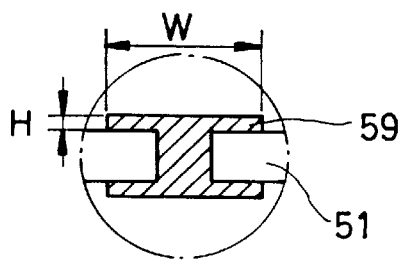

FIG. 7 is a plan view of a lead frame used for manufacturing the semiconductor package depicted in FIG. 6. Two segments of split die pad (51) are coupled together by a thermosetting resin (59). The disjunction part filled with a resin has the "I" shape, as shown in an enlarged view thereof, to assure a secure coupling of two segments. The split die pad (51) is split into two segments in such a way that one segment thereof is coupled to tiebars (55b, 57b) connected to Vcc, and to inner lead (56a) connected to Vss, while the other segment is coupled to tiebars (55a, 57a) connected to Vss, and to inner lead (56b) connected to Vcc.

The width (W) and the height of the resin (59) covering the surface of the die pad (51) is preferably more than 20 μM to assure a secure coupling of segments, and less than 40 μm so as not to cause an increase in the total height of the package, respectively.

The above described center power type semiconductor package according to the present invention can efficiently reduce noise, because the length of the leads are reduced by placing inner leads and tiebars, which are connected to ground and power terminals (Vcc, Vss), at centers of each side of the chip, and the power may be supplied through a plurality parallel paths. Moreover, like the semiconductor package described above in connection with FIG. 4, since the segments of split die pad are firmly coupled together through a non-conductive thermosetting resin, the insulation between the segments is assured, and there is no possibility of leakage of adhesive. Furthermore, because the resin has a similar coefficient of thermal expansion to that of the molding resin, the package failure due to the formation of crack can be significantly reduced.

Figure 8:
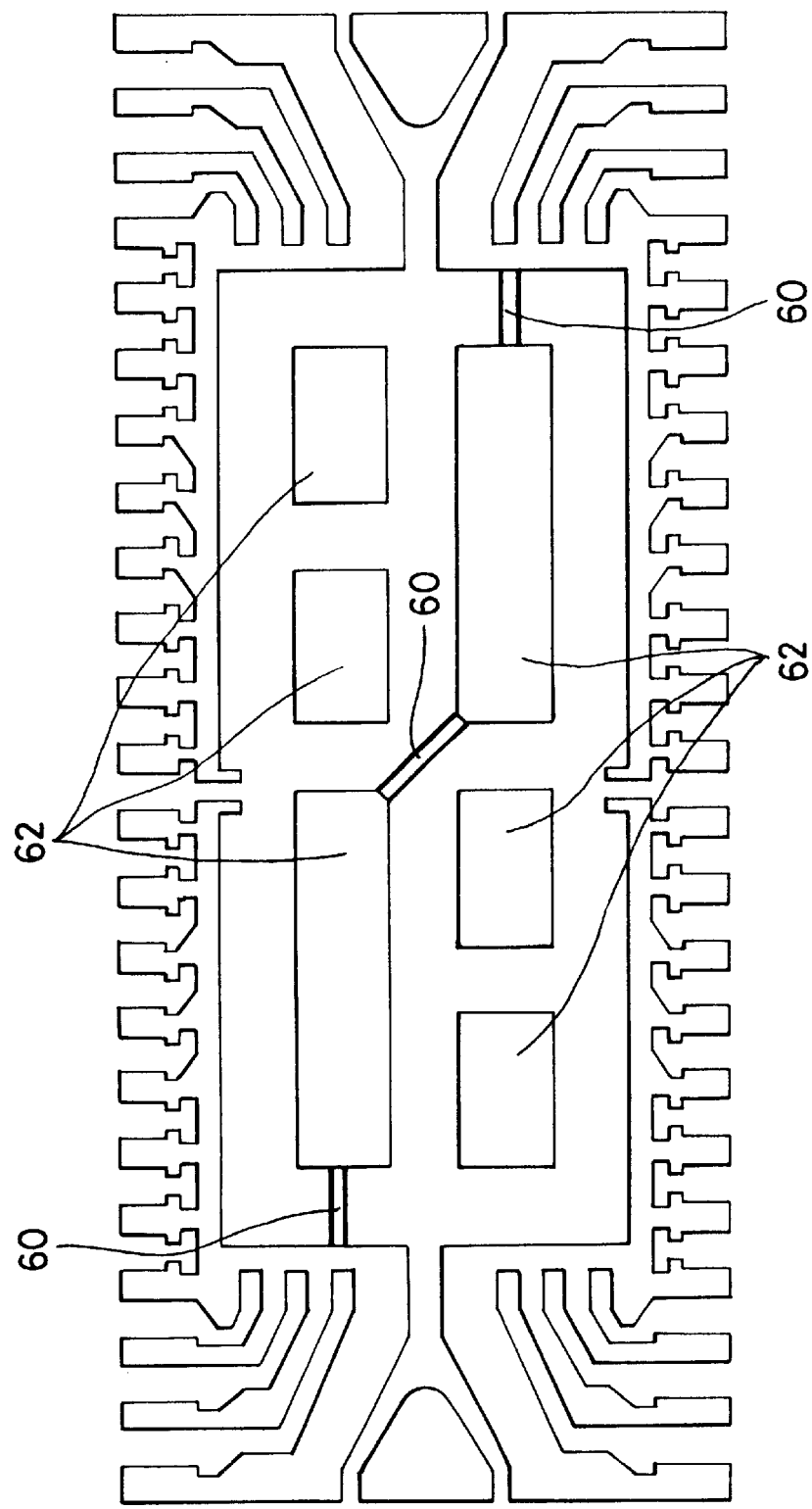
FIG. 8 is a plan view of a lead frame formed with a plurality of through holes and having the split die pad according to the present invention.

FIG. 8 is a plan view of a lead frame formed with a plurality of through holes (62) on split die pad (61) to improve the bonding between the chip and molding resin. If a die pad formed with through holes is used, the molding resin penetrates through the holes to the lower surface of the chip so that the bonding between the chip and die pad can be improved and that stress due to moisture absorption during the reflow process wherein the semiconductor package is mounted onto printed circuit board can be released, thereby preventing the formation of package crack.

As can be seen from FIG. 8, die pad (61) is divided into two segments by three resin decoupling capacitors (60), which are placed in parallel so that, even when the dielectric coefficient is small, the total capacitance can become large. Of course, if a larger capacitance is required, die pad may be divided into three or more segments.

FIG. 9 is a schematic circuit diagram showing the impedance between external power supply Vcc and ground terminal Vss, when the chip is connected with external terminals through the lead frame depicted in FIG. 8.

For FIG. 9, each bonding wire components also depicted. For example, $L_{w1}$ indicates inductance of wires which connect the chip to inner leads (only two of three wires shown in FIG. 4 and FIG. 6 are shown in FIG. 9), and $L_{w2}$ indicates inductance of wires which connect the chip to tiebars. $L_L$ indicates inductance of lead frame itself and is divided into three components, $L_{DP1}$, $L_{DP2}$, and $L_{DP3}$, because the die pad of lead frame contains three parts formed by through holes.

The total capacitance of three capacitors is 3C, because these capacitors are coupled in parallel as described above. $R_L$ is a resistance of the chip.

As can be seen from FIG. 9, since die pad is divided and inductances are coupled together in parallel, the total inductance is reduced. And the resin coupling the segments of split die pad serves as decoupling capacitors so that noise can be significantly reduced.

FIG. 10 is a perspective view of another embodiment of lead frame in accordance with the present invention. Die pad is divided into two segments, (75a) and (75b), and a multi-layer capacitor (70) is interposed therebetween. This structure solves the problem associated with the resin capacitor, that is to say, the former allows a free control of capacitance while the latter does not. The multi-layer capacitor (70) has a comb structure wherein the conductive projecting plates of two electrodes (72), which face to each other, cross each other within a dielectric material (73) interposed therebetween. By using this type of multi-layer capacitor, any desired capacitance can be obtained during the early stage of lead frame manufacturing process by adjusting the number of and/or distance between each conductive plate, and/or by varying the overlapping area, thereby allowing an effective reduction of noise.

If a large semiconductor chip is mounted on the lead frames according to the invention described hereinbefore, a metal having a low coefficient of thermal expansion, for example alloy 42 may be used as a material of lead frame to prevent a formation of crack of package <Table 1>. For this case, since alloy 42 has a relatively poor electrical conductivity compared with other materials, it may cause a noise during the operation of elements. To avoid this problem, it is preferable to provide a Ag plate on the surface of die pad and inner leads of Alloy 42 lead frame.

TABLE 1

| Material | Coefficient of thermal expansion (25–300° C.) | Electric conductivity at 20° C. |
| --- | --- | --- |
| Copper (Olin 194) | 17.4 | 60% IACS |
| Copper (Olin 151) | 17.4 | 90% IACS |
| Alloy 42 (Fe + Ni, Ni 42%) | 4.5 | 3.0% IACS |
| Alloy 50 (Fe + Ni, Ni 50%) | 10.0 | 4.1% IACS |

Figure 11A:
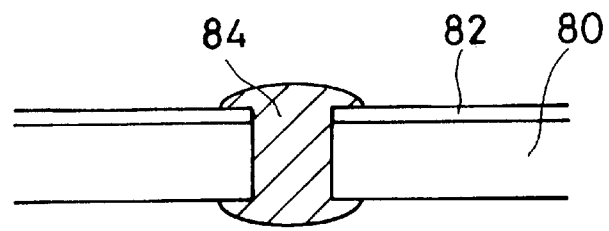
FIGS. 11A and 11B are cross-sectional views of lead frames having a silver plating thereon.
Figure 11B:
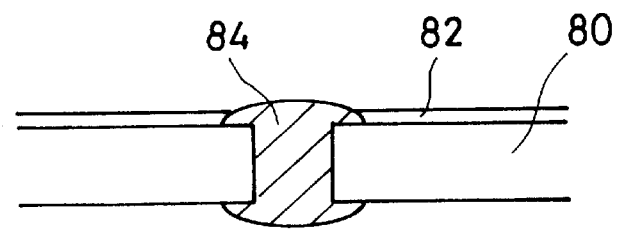

FIGS. 11A and 11B are cross-sectional views of lead frames having a silver plating thereon. FIG. 11A shows a lead frame wherein silver plating (82) is formed on die pad (80) followed by placing a resin or multi-layer capacitor (84). FIG. 11B shows a lead frame wherein a resin or multi-layer capacitor (84) is placed followed by forming a silver plating (92) thereon. For the former case, the package has a disadvantage that the height of the capacitor becomes high because the capacitor is formed after the formation of silver plating. On the other hand, the latter case has a disadvantage that the silver plating may be contaminated by the capacitor resin. Nevertheless, none of these cases has adverse effect on the electrical properties of lead frame itself and the choice is up to the designer.

Figure 11C:
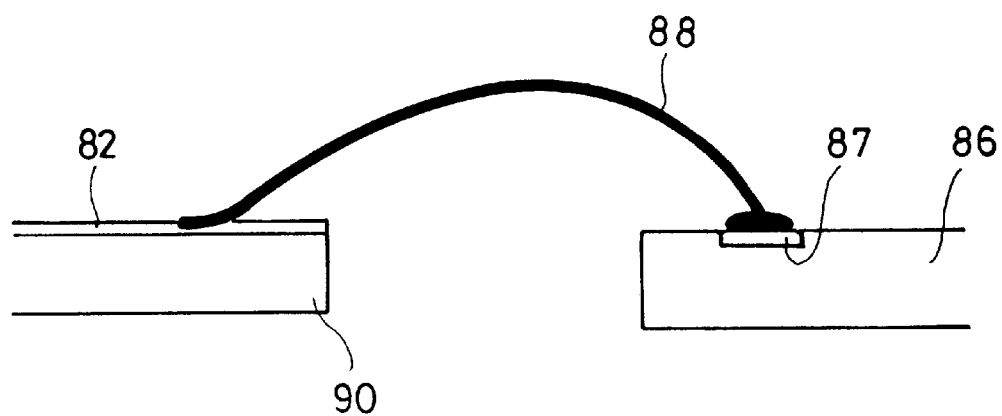
FIG. 11C is a cross-sectional view of an electrical connection between a chip and a inner lead having silver plating.

FIG. 11C is a cross-sectional view of an electrical connection between the chip (86) and a silver-plated (82) inner lead (90) through wire (88). Since the gold bonding wire (88) is connected to the silver (82), most of current is transferred to silver by skin effect, thereby attaining a high electric conductivity even though a low electrically conductive alloy 42 is used as lead frame.

As described above, the split die pads according to the present invention make it possible to efficiently reduce noise by supplying powers (Vcc, Vss) to the chip through diverse paths such as die pad, tiebars and bonding wires, and by coupling separate segments of split die pad by a non-conductive thermosetting resin or multi-layer capacitor, which serves as a decoupling capacitor. Furthermore, the use of a thermosetting resin or multi-layer capacitor makes it possible to prevent a leakage of adhesive used for attaching die pad to the chip, thereby preventing a formation of package crack.

Although a preferred embodiments of the present invention have been described in detail hereinabove, it should be clearly understood that many variations and/or modifications of the basic inventive concepts herein taught which my appear to those skilled in the art will still fall within the spirit and scope of the present invention as defined in the appended claims.

What is claimed is:

1. A semiconductor package, comprising:
   a semiconductor chip having a plurality of bonding pads;

a die pad physically divided into a plurality of segments which spacedly adjoin one another edge to edge;

at least one electrically non-conductive connector firmly mechanically coupling respective spacedly adjoining respective adjoining ones of said die pad segments to one another by securing to respective adjoining ones of said die pad segments at respective ones of said edges and filling space between said edges;

an electrically non-conductive adhesive adhering said semiconductor chip facewise to a plurality of said segments; said non-conductive adhesive being excluded from said space by said at least one non-conductive connector;

a lead frame having a plurality of inner leads and a plurality of outer leads;

a plurality of wires electrically connecting respective ones of said inner leads to respective ones of said bonding pads; and a body of molding resin at least partly encapsulating said semiconductor chip, said die pad, said at least one electrically non-conductive connector, said electrically non-conductive adhesive, said wires, and said inner leads of said lead frame;

said at least one electrically non-conductive connector having a coefficient of thermal expansion which is similar to that of said body of molding resin.

2. The semiconductor package as claimed in claim 1, wherein said non-conductive connector is an acryl resin, an epoxy resin, a silicon resin, or a polyimide resin.

3. The semiconductor package as claimed in claim 1, wherein said die pad is split into two segments, one of which is connected to a ground terminal and the other of which is connected to a power terminal.

4. The semiconductor package as claimed in claim 3, wherein said ground terminal and power terminal are connected to the bonding pads of the semiconductor chip.

5. The semiconductor package as claimed in claim 1, wherein said electrical connection between the bonding pads and the inner leads is a wire bonding, and the segments of split die pad and the inner leads are covered with a metal plating which has a higher electric conductivity than that of said inner leads.

6. The semiconductor package as claimed in claim 5, wherein said inner leads are made of alloy 42, and said metal is Ag.

7. The semiconductor package as claimed in claim 1, wherein said split die pad segments have at least one hole.

8. The semiconductor package as claimed in claim 7, wherein each said non-conductive connector is a multi-layer capacitor.

9. The semiconductor package as claimed in claim 8, wherein said multi-layer capacitor has two electrodes facing each other, said electrodes comprising electrically conductive projecting plates cross each other within a dielectric material interposed therebetween.

10. The semiconductor package of claim 7, wherein at least one said hole is complementarily through both of two of said segments and remains unfilled by said connector.

11. The semiconductor package as claimed in claim 7, wherein each said non-conductive connector is an acryl resin, an epoxy resin, a silicon resin, or a polyimide resin.

12. The semiconductor package as claimed in claim 1, wherein said non-conductive connector is a multi-layer capacitor.

* * * * *